(12) United States Patent
Tseng

(10) Patent No.: US 11,656,720 B2
(45) Date of Patent: May 23, 2023

(54) DISPLAY DEVICE AND CONTROL METHOD THEREOF

(71) Applicant: E Ink Holdings Inc., Hsinchu (TW)

(72) Inventor: Hung-Wei Tseng, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 126 days.

(21) Appl. No.: 17/446,167

(22) Filed: Aug. 27, 2021

(65) Prior Publication Data

US 2022/0283691 A1 Sep. 8, 2022

(30) Foreign Application Priority Data

Mar. 3, 2021 (TW) ................................. 110107544

(51) Int. Cl.
*G06F 3/041* (2006.01)
*H03M 3/00* (2006.01)

(52) U.S. Cl.
CPC ........ *G06F 3/04186* (2019.05); *G06F 3/0412* (2013.01); *H03M 3/34* (2013.01); *H03M 3/368* (2013.01)

(58) Field of Classification Search
CPC .. G06F 3/04186; G06F 3/0412; G06F 3/0418; G06F 3/044; G06F 3/046; H03M 3/368; H03M 3/34
See application file for complete search history.

(56) References Cited

U.S. PATENT DOCUMENTS

2017/0131829 A1* 5/2017 Takahashi ........... G06F 3/04182

FOREIGN PATENT DOCUMENTS

| TW | 201205403 A | 2/2012 |
|---|---|---|
| TW | 201214235 A | 4/2012 |

* cited by examiner

*Primary Examiner* — Yaron Cohen
(74) *Attorney, Agent, or Firm* — CKC & Partners Co., LLC

(57) ABSTRACT

A display device includes a display panel, a noise detection circuit and a processing circuit. The display panel has a touch control function and is configured to detect a contact location of an object to output a touch signal. The noise detection circuit is configured to detect and process a voltage signal of a common electrode of the display panel to output a free run signal and a noise sync signal. The processing circuit is configured to receive the free run signal and the noise sync signal. When the free run signal is at a first level, the processing circuit receives the touch signal in real-time. When the free run signal is at a second level different to the first level, the processing circuit receives the touch signal according to the noise sync signal. The present disclosure also provides a control method for the display device.

16 Claims, 6 Drawing Sheets

DISPLAY DEVICE AND CONTROL METHOD THEREOF

CROSS-REFERENCE TO RELATED APPLICATION

This application claims priority to Taiwan Application Serial Number 110107544, filed Mar. 3, 2021, which is herein incorporated by reference in its entirety.

BACKGROUND

Field of Invention

This disclosure relates to a display device and control method thereof, and in particular to a display device having the noise detection circuit and control method thereof.

Description of Related Art

Because the noise generated in the process of displaying (e.g., the process of turning page) is large, the coordinates that are generated by the electrophoretic display (EPD) according to the active capacitive stylus pen or the electromagnetic radiation (EMR) stylus pen usually have problems. For example, the location is displayed incorrectly or is displayed late.

The current solution is to filter all signals generated in the process of displaying. However, in the process of filtering, the display is unable to perform the detection of coordinates or is required to perform certain complicated algorithms to obtain the coordinates, so as to delay the generation of coordinates.

SUMMARY

An aspect of present disclosure relates to a display device. The display device includes a display panel, a noise detection circuit and a processing circuit. The display panel includes a common electrode, wherein the display panel has a touch control function, and is configured to detect a contact location of an object, so as to output a touch signal. The noise detection circuit is configured to detect and process a voltage signal of the common electrode, so as to output a free run signal and a noise sync signal. The processing circuit is coupled to the display panel and the noise detection circuit, and is configured to receive the free run signal and the noise sync signal. When the free run signal is at a first level, the processing circuit receives the touch signal outputted by the display panel in real-time, and converts the touch signal into a location signal. When the free run signal is at a second level different to the first level, the processing circuit receives the touch signal outputted by the display panel according to the noise sync signal, and converts the touch signal into the location signal.

Another aspect of present disclosure relates to a control method. The control method is applied to a display device and includes: detecting a contact location of an object, by a display panel having a touch control function, so as to output a touch signal; and detecting and processing a voltage signal of a common electrode of the display panel, by a noise detection circuit, so as to output a free run signal and a noise sync signal. When the free run signal is at a first level, the touch signal outputted by the display panel is received in real-time, and is converted into a location signal by a processing circuit. When the free run signal is at a second level different to the first level, the touch signal outputted by the display panel is received according to the noise sync signal, and is converted into the location signal by the processing circuit.

DETAILED DESCRIPTION

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "coupled" or "connected" as used herein may mean that two or more elements are directly in physical or electrical contact, or are indirectly in physical or electrical contact with each other. It can also mean that two or more elements interact with each other.

Figure 1:
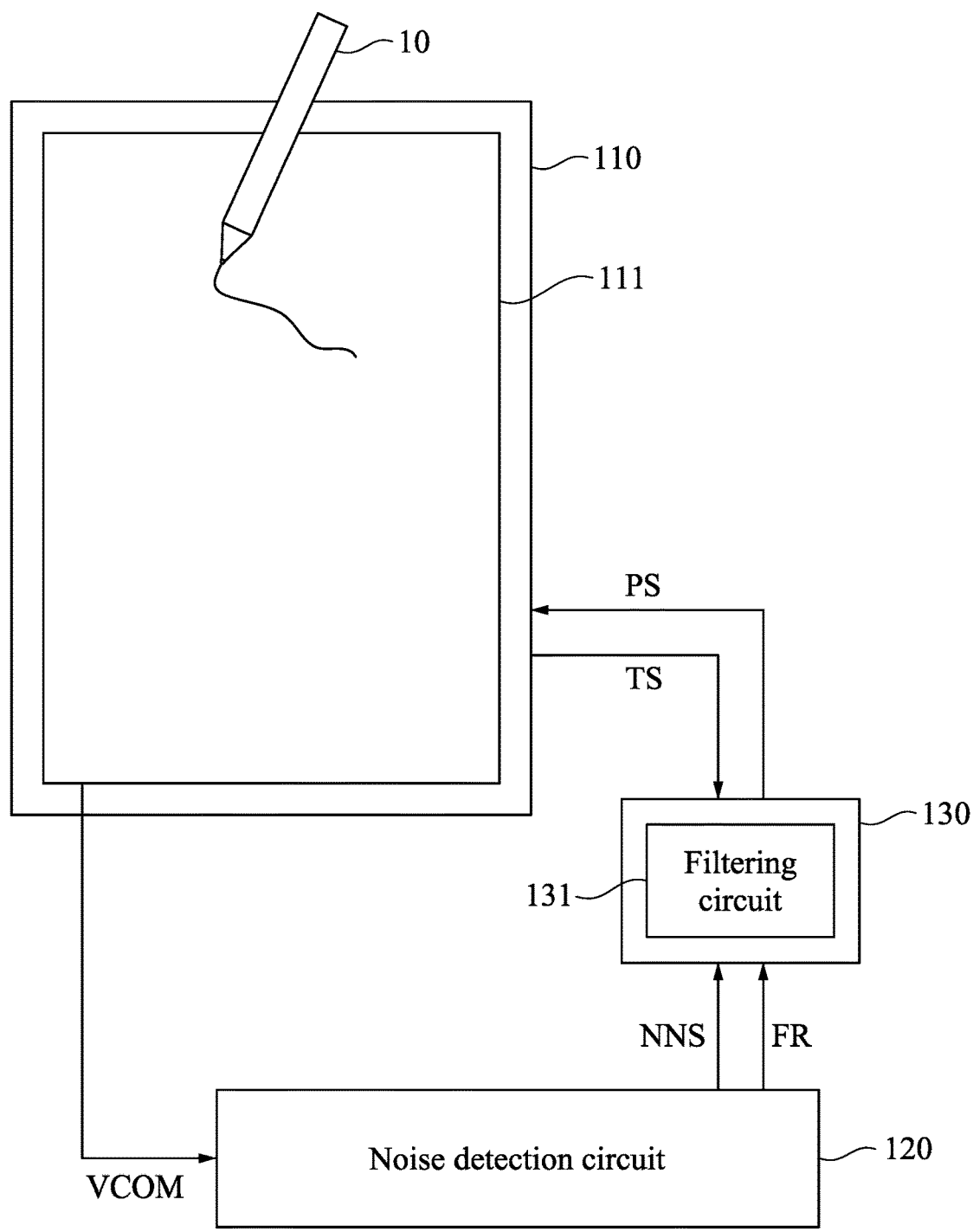
FIG. 1 is a schematic diagram of the display device in accordance with some embodiments of the present disclosure.

Referring to FIG. 1, a display device 100 in accordance with one embodiment of the present disclosure includes a display panel 110, a noise detection circuit 120 and a processing circuit 130. The display device 100 can be the electrophoretic display (EPD). However, the present disclosure is not limited thereto. When an object 10 (e.g., finger, active capacitive stylus pen, EMR stylus pen) is operated on the display panel 110 of the display device 100, the processing circuit 130 would control the display panel 110 to display a corresponding indicator (e.g., cursor, script).

In some embodiments, the display panel 110 detects the contact location of the object 10 to output a touch signal TS to the processing circuit 130. The processing circuit 130 receives the touch signal TS for calculation, so as to convert the touch signal TS into a location signal PS. For example, the location signal PS includes coordinate information on a reference coordinate system (not shown). The reference coordinate system could be a screen coordinate system of the display panel 110. The display panel 110 receives the location signal PS generated by the processing circuit 130, so as to display the indicator on a coordinate corresponding to the contact location of the object 10.

Specifically, the display panel 110 includes a common electrode 111 and a display electrode (not shown). A plurality of microcapsules (not shown) are formed between the common electrode 111 and the display electrode, and each of the microcapsules includes a plurality of positive charged particles and a plurality of negative charged particles. In some embodiments, the display panel 110 provides a voltage difference between the common electrode 111 and the display electrode through a drive circuit (not shown), so as to control the movement of the positive charged particles and the negative charged particles. The drive circuit can provide different voltage differences for different locations on the display panel 110 according to the location signal PS generated by the processing circuit 130, so as to display the indicator (e.g., image).

However, the location signal PS is easily affected by the noise in the process of displaying, hence the display panel 110 might display the indicator on the incorrect location or might delay the display of the indicator. It is worth noting that the noise detection circuit 120 is coupled to the display panel 110 and receives a voltage signal VCOM of the common electrode 111, so as to detect the noise. The processing circuit 130 is coupled to the noise detection circuit 120 and the display panel 110 and is operated according to the detection result of the noise detection circuit 120. In such way, the above-described problems of the display device 100 could be solved.

Figure 2:
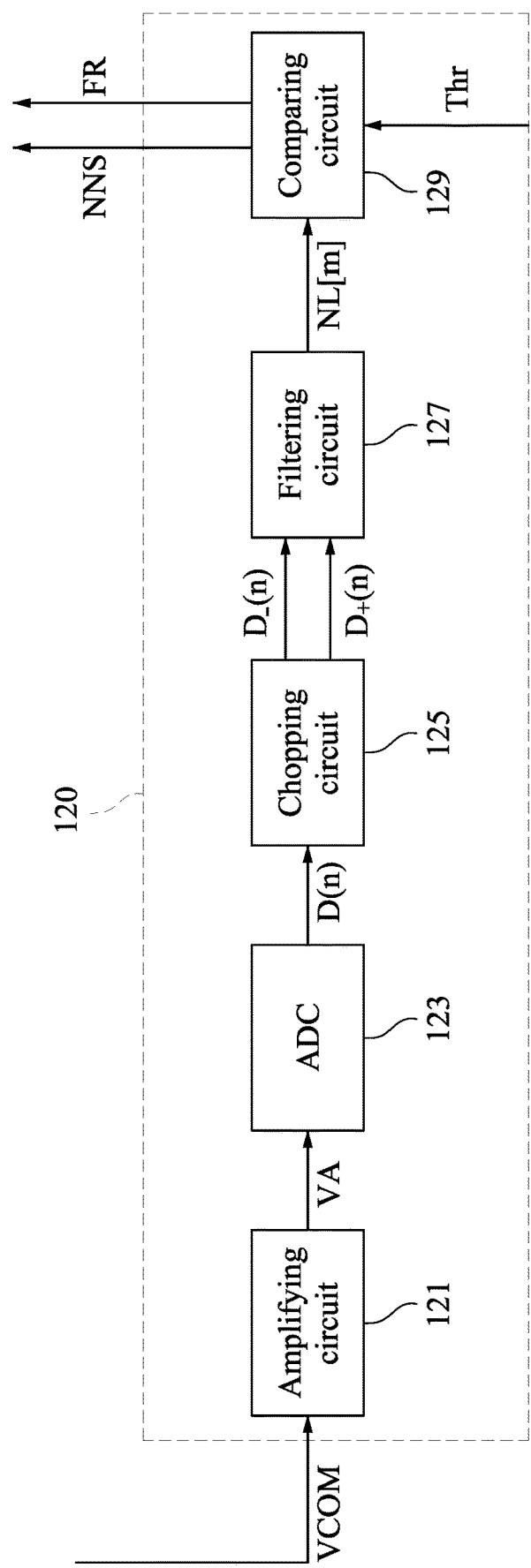
FIG. 2 is a schematic diagram of the noise detection circuit of the display device in accordance with some embodiments of the present disclosure.

Referring to FIG. 2, in some embodiments, the noise detection circuit 120 includes an amplifying circuit 121, an analog-to-digital convertor (ADC) 123, a chopping circuit 125, a filtering circuit 127 and a comparing circuit 129. The amplifying circuit 121 is configured to receive and amplify the voltage signal VCOM of the common electrode 111, so as to generate an amplified voltage signal VA.

Figure 3:
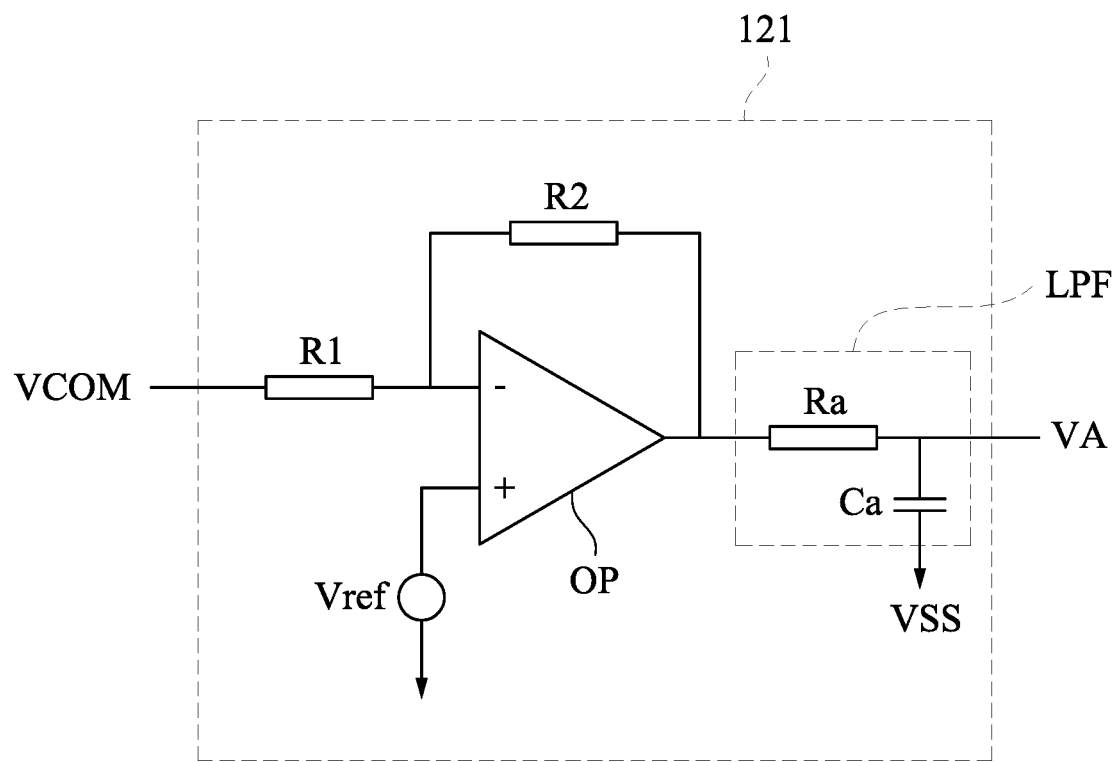
FIG. 3 is a schematic diagram of the amplifying circuit of the noise detection circuit in accordance with some embodiments of the present disclosure.

Referring to FIG. 3 together, specifically, the amplifying circuit 121 includes a resistor R1, a resistor R2, an operational amplifier OP and a low pass filtering circuit LPF. The resistor R1 is coupled between the input terminal of the amplifying circuit 121 and the negative input terminal of the operational amplifier OP. The resistor R2 is coupled between the negative input terminal of the operational amplifier OP and the output terminal of the operational amplifier OP. The positive input terminal of the operational amplifier OP receives a reference voltage Vref. In some embodiments, the amplified voltage signal VA can be represented as the following equation (1):

$$VA = Vref - \frac{R2}{R1}VCOM, \quad (1)$$

where the resistance of the resistor R1 is 10 kΩ, the resistance of the resistor R2 is 10 kΩ, the reference voltage Vref is 0 V, and the voltage signal VCOM is −1.5 V of DC (direct current) voltage. It is noting that the voltage signal VCOM might be affected by the noise to have the variation (e.g., ±1 V).

As shown in FIG. 3, low pass filtering circuit LPF includes a resistor Ra and a capacitor Ca, and is configured to reduce the distortion of the amplified voltage signal VA. The resistor Ra is coupled between the output terminal of the operational amplifier OP and the output terminal of the amplifying circuit 121. One terminal of the capacitor Ca is coupled between the resistor Ra and the output terminal of the amplifying circuit 121, and the other terminal of the capacitor Ca receives a system low voltage VSS. Specifically, the resistance of the resistor Ra can be 4.7 kΩ, and the capacitance of the capacitor Ca can be 100 pF.

As shown in FIG. 2, the analog-to-digital convertor 123 is coupled to the amplifying circuit 121, and is configured to convert the amplified voltage signal VA from the analog form to the digital form, so as to generate a digital voltage signal D(n). The chopping circuit 125 is coupled to the analog-to-digital convertor 123, and is configured to generate a first digital voltage signal $D_+(n)$ and a second digital voltage signal $D_-(n)$ according to a reference value (not shown) and the digital voltage signal D(n). In some embodiments, the first digital voltage signal $D_+(n)$ and the second digital voltage signal $D_-(n)$ can be represented as the following equations (2) and (3):

$$D_+(n)=D(n)-Dref \quad (2); \text{ and}$$

$$D_-(n)=Dref-D(n) \quad (3),$$

where Dref is the reference value, and the sampling point of n can be 8, 16, 32 or 64. In some embodiments, Dref can be represented as: $Dref=VA/2^m$, where m can be 10.

The filtering circuit 127 is coupled to the chopping circuit 125, and is configured to generate a noise level signal NL[m] according to the first digital voltage signal $D_+(n)$ and the second digital voltage signal $D_-(n)$. In some embodiments, the filtering circuit 127 can be the average filter. In some embodiments, the noise level signal NL[m] can be represented as the following equation (4):

$$NL[m] \times 2 = \frac{\sum_{1}^{o}(D_+(n) + D_-(n))}{o}, \quad (4)$$

where o can be 8, 16 or 32.

The comparing circuit 129 is coupled to the filtering circuit 127 and the processing circuit 130, and is configured to compare the noise level signal NL[m] with a threshold value Thr (e.g., 800-1000). According to the comparison result of the noise level signal NL[m] and the threshold value, the comparing circuit 129 outputs a free run signal FR with the high voltage level or the low voltage level to the processing circuit 130. In some embodiments, the noise detection circuit 120 selectively outputs a noise sync signal NNS to the processing circuit 130 according to the voltage level of the free run signal FR by the comparing circuit 129.

As shown in FIG. 1 again, the processing circuit 130 is coupled to the display panel 110 and the noise detection circuit 120, and is configured to receive the free run signal FR and the noise sync signal NNS generated by the noise detection circuit 120, so as to perform the related operations for the display panel 110.

In some embodiments, the processing circuit 130 includes a filtering circuit 131. The filtering circuit 131 can be the median filter. When the noise is detected by the noise detection circuit 120, the processing circuit 130 can filter the location signal PS calculated by the processing circuit 130 through the filtering circuit 131, so as to eliminate the effect of the noise.

Figure 4:
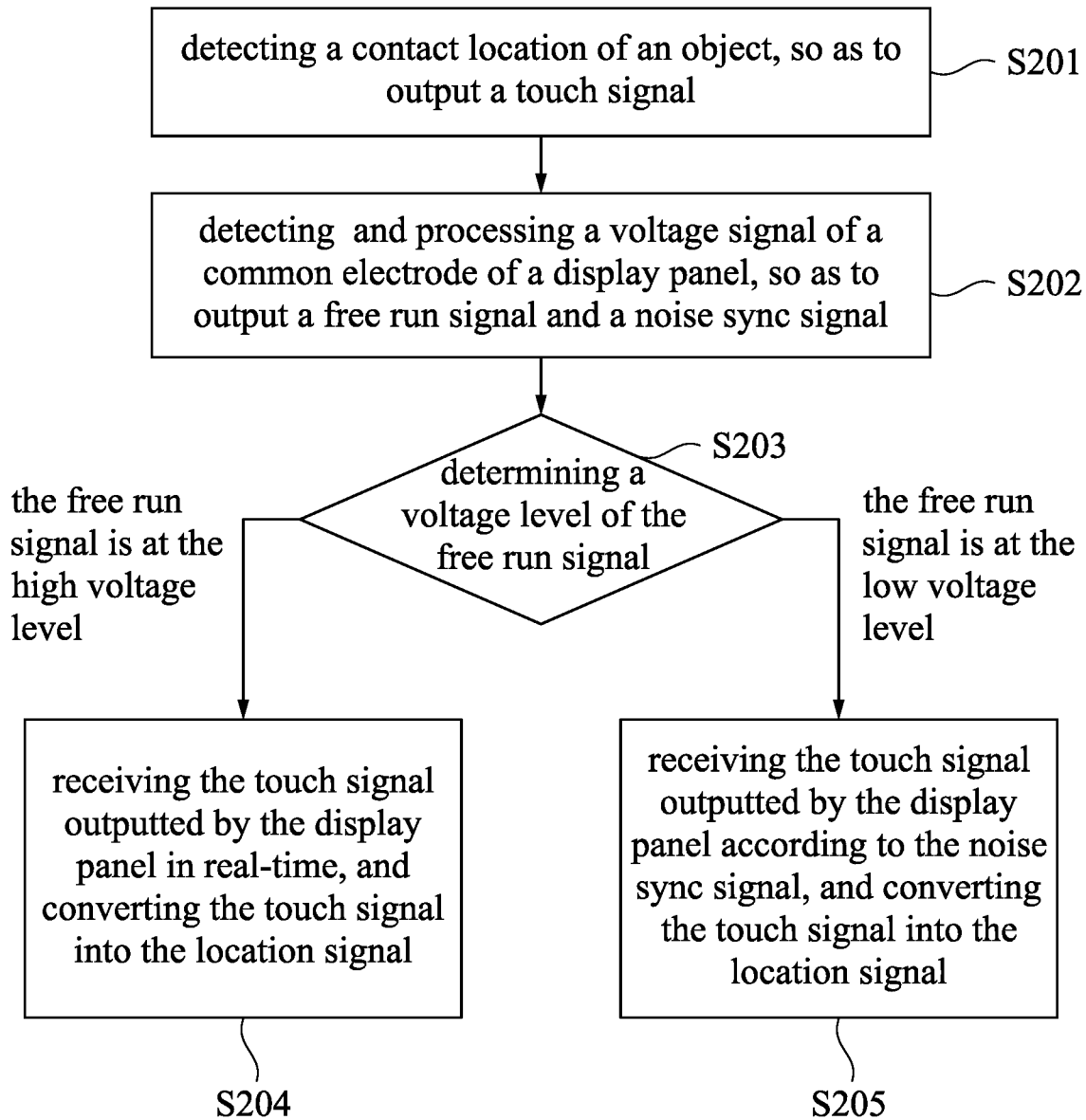
FIG. 4 is a flow diagram of the control method of the display device in accordance with other embodiments of the present disclosure.

Referring to FIG. 4, FIG. 4 illustrates a control method 200 in accordance with an embodiment of the present disclosure. The control method 200 can be performed by the display device 100 as shown in FIG. 1, so that the related operations can be performed. In some embodiments, the control method 200 includes the operations S201-S205.

In the operation S201, the display device 100 detects the contact location of the object 10 to output the touch signal TS by the display panel 110. In the operation S202, the display device 100 detects and processes the voltage signal VOM of the common electrode 111 of the display panel 110 to output the free run signal FR and the noise sync signal NNS by the noise detection signal 120.

Figure 5:
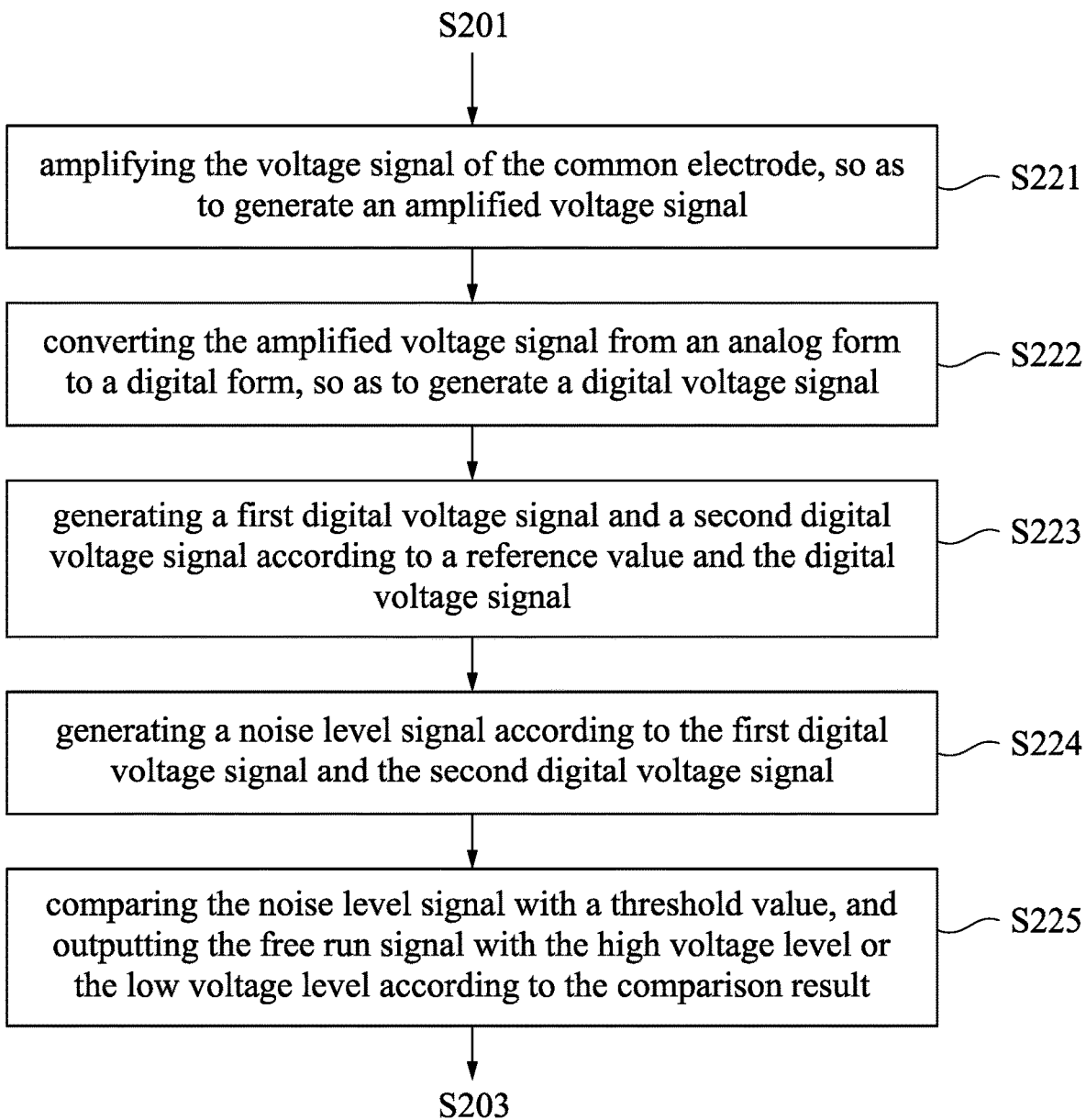
FIG. 5 is a flow diagram of one of the operations of the control method in accordance with some embodiments of the present disclosure.

Referring to FIG. 5 together, in some embodiments, the operation S202 includes the sub-operations S221-S225. In the sub-operation S221, the display device 110 amplifies the voltage signal VCOM of the common electrode 111 to generate the amplified voltage signal VA by the amplifying circuit 121. In the sub-operation S222, the display device 100 converts the amplified voltage signal VA from the analog form to the digital form to generate the digital voltage signal D(n) by the analog-to-digital convertor 123. In the sub-operation S223, the display device 100 generates the first digital voltage signal $D_+(n)$ and the second digital voltage signal $D_-(n)$ according to the reference value and the digital voltage signal D(n) by the chopping circuit 125. In the sub-operation S224, the display device 100 generates the noise level signal NL[m] according to the first digital voltage signal $D_+(n)$ and the second digital voltage signal $D_-(n)$ by the filtering circuit 127. In the sub-operation S225, the display device 100 compares the noise level signal NL[m] with the threshold value Thr, and outputs the free run signal FR with the high voltage level or the low voltage level according to the comparison result of the noise level signal NL[m] and the threshold value Thr by the comparing circuit 129.

As shown in FIG. 4, in the operation S203, by the processing circuit 130, the display device 100 then receives the free run signal FR and determines the voltage level of the free run signal FR to perform either the operation S204 or the operation S205.

In some embodiments, the voltage signal VCOM is not affected by the noise, so that the noise level signal NL[m] outputted by the filtering circuit 127 is not greater than the threshold value Thr. Accordingly, the comparing circuit 129 outputs the free run signal FR with the high voltage level. As shown in FIG. 4, in the operation S204, when the free run signal FR is at the high voltage level, the display device 100 receives the touch signal TS outputted by the display panel 110 in real-time, and converts the touch signal TS into the location signal PS by the processing circuit 130.

In other embodiments, the voltage signal VCOM is affected by the noise, so that the noise level signal NL[m] outputted by the filtering circuit 127 is greater than the threshold value Thr. Accordingly, the comparing circuit 129 outputs the free run signal FR with the low voltage level. As shown in FIG. 4, in the operation S205, when the free run signal FR is at the low voltage level, the display device 100 receives the touch signal TS outputted by the display panel 110 according to the noise sync signal NNS, and converts the touch signal TS into the location signal PS by the processing circuit 130. In addition, when the free run signal FR is at the low voltage level, the display device 100 further filters the location signal PS by the filtering circuit 131 of the processing circuit 130.

Figure 6:
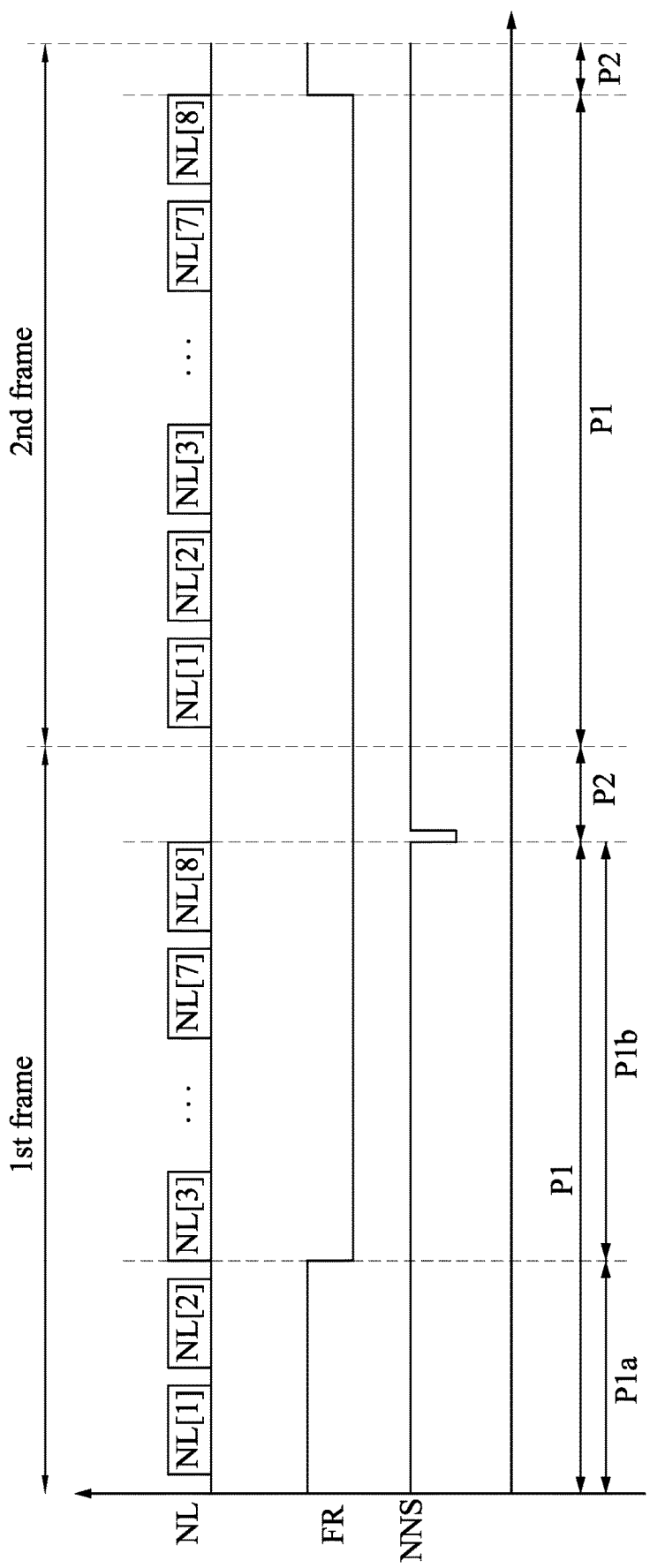
FIG. 6 is a timing chart of the noise level signal, the free run signal and the noise sync signal in accordance with some embodiments of the present disclosure.

Referring to FIG. 6, FIG. 6 illustrates the timing chart of the noise level signal NL[m], the free run signal FR and the noise sync signal NNS. As shown in FIG. 6, a time (e.g., 1/75 sec) of frame (e.g., the first (1st) frame, the second (2nd) frame) includes a first period P1 and a second period P2. In the first period P1 of the first frame, the display device 100 performs the operation for detecting noise by the noise detection circuit 120. In some embodiments, in the time of frame, the filtering circuit 127 outputs eight of the noise level signals NL[1]-NL[8]. In such way, the noise detection can be performed at least one time before each time the object 10 (e.g., the stylus pen) outputs the signal.

For example, in a sub-period P1a of the first period P1 of the first frame, the voltage signal VCOM is not affected by the noise. Therefore, the noise level signals NL[1]-NL[2] outputted by the filtering circuit 127 each are not greater than the threshold value Thr, so that the free run signal FR is maintained at the high voltage level. When the free run signal FR is at the high voltage level, the processing circuit 130 can perform the operation of touch sense (i.e., the above-described operation for calculating the location signal PS) freely.

In a sub-period P1b of the first period P1 of the first frame, the voltage signal VCOM is affected by the noise. Therefore, the noise level signals NL[3]-NL[8] outputted by the filtering circuit 127 each are greater than the threshold value Thr, so that the free run signal FR is switched to the low voltage level. When the free run signal FR is at the low voltage level, the processing circuit 130 is limited to perform the operation of touch sense in the condition that the noise sync signal NNS is at the low voltage level, and further performs the operation of filter (i.e., the above-described operation for filtering the location signal PS) by the filtering circuit 131.

In the second period P2 of the first frame, the display device 100 ends the operation for detecting noise. Furthermore, the display device 100 performs the operations of touch sense and filter according to the noise sync signal NNS with the low voltage level by the processing circuit 130, so as to compensate for the operation of touch sense that is cancelled due to the noise interference.

In some embodiments, the above-described reference value Dref can be calculated in the second period P2. For example, in the second period P2, the processing circuit 130 can average eight of the digital voltage signals D(n) generated in the first period P1 to calculate the reference value Dref, so as to provide for the chopping circuit 125.

In other embodiments, in the first period P1 of the second frame, the free run signal FR is still maintained at the low voltage level, which represents that the display device 100 is still affected by the noise. Therefore, the processing circuit 130 is still limited. At the final of the first period P1 of the second frame, the free run signal FR is switched from the low voltage level to the high voltage level since the noise interference disappears. In the second period P2 of the second frame, the processing circuit 130 can perform the operation of touch sense freely according to the free run signal FR with the high voltage level.

In sum, the display device 100 of the present disclosure detects the noise by the noise detection circuit 120, so as to generate the free run signal FR and the noise sync signal correspondingly. When the noise is detected, the processing circuit 130 of the display device 100 can selectively perform the operations of touch sense and filter according to the voltage level of the free run signal FR and the noise sync signal NNS. In such way, the problems of complicated algorithms and delay in the generation of coordinates can be solved.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A display device, comprising:
a display panel comprising a common electrode, wherein the display panel has a touch control function, and is configured to detect a contact location of an object, so as to output a touch signal;
a noise detection circuit configured to detect and process a voltage signal of the common electrode, so as to output a free run signal and a noise sync signal; and
a processing circuit coupled to the display panel and the noise detection circuit, and configured to receive the free run signal and the noise sync signal, wherein,
when the free run signal is at a first level, the processing circuit receives the touch signal outputted by the display panel in real-time, and converts the touch signal into a location signal,
when the free run signal is at a second level different to the first level, the processing circuit receives the touch signal outputted by the display panel according to the noise sync signal, and converts the touch signal into the location signal.

2. The display device of claim 1, wherein the processing circuit comprises a first filtering circuit, and the processing circuit filters the location signal by the first filtering circuit when the free run signal is at the second level.

3. The display device of claim 1, wherein the noise detection circuit comprises:
an amplifying circuit configured to amplify the voltage signal of the common electrode, so as to generate an amplified voltage signal;
an analog-to-digital convertor coupled to the amplifying circuit, and configured to convert the amplified voltage signal from an analog form to a digital form, so as to generate a digital voltage signal;
a chopping circuit coupled to the analog-to-digital convertor, and configured to generate a first digital voltage signal and a second digital voltage signal according to a reference value and the digital voltage signal;
a second filtering circuit coupled to the chopping circuit, and configured to generate a noise level signal according to the first digital voltage signal and the second digital voltage signal; and
a comparing circuit coupled to the second filtering circuit, and configured to compare the noise level signal with a threshold value.

4. The display device of claim 3, wherein when the noise level signal is not greater than the threshold value, the comparing circuit outputs the free run signal with the first level.

5. The display device of claim 3, wherein when the noise level signal is greater than the threshold value, the comparing circuit outputs the free run signal with the second level.

6. The display device of claim 3, wherein the second filtering circuit outputs eight of the noise level signals in a frame time.

7. The display device of claim 1, wherein when the noise sync signal is at a third level, the processing circuit does not receive the touch signal outputted by the display panel.

8. The display device of claim 7, wherein when the noise sync signal is at a fourth level different to the third level, the processing circuit receives the touch signal outputted by the display panel, and converts the touch signal into the location signal.

9. A control method applied to a display device, comprising:
detecting a contact location of an object, by a display panel having a touch control function, so as to output a touch signal; and
detecting and processing a voltage signal of a common electrode of the display panel, by a noise detection circuit, so as to output a free run signal and a noise sync signal, wherein,
when the free run signal is at a first level, the touch signal outputted by the display panel is received in real-time, and is converted into a location signal by a processing circuit,
when the free run signal is at a second level different to the first level, the touch signal outputted by the display panel is received according to the noise sync signal, and is converted into the location signal by the processing circuit.

10. The control method of claim 9, wherein the location signal is filtered by a first filtering circuit included by the processing circuit when the free run signal is at the second level.

11. The control method of claim 9, wherein detecting and processing the voltage signal of the common electrode of the display panel, by the noise detection circuit, so as to output the free run signal and the noise sync signal comprises:
amplifying the voltage signal of the common electrode, by an amplifying circuit, so as to generate an amplified voltage signal;
converting the amplified voltage signal from an analog form to a digital form, by an analog-to-digital convertor, so as to generate a digital voltage signal;
generating a first digital voltage signal and a second digital voltage signal according to a reference value and the digital voltage signal, by a chopping circuit;
generate a noise level signal according to the first digital voltage signal and the second digital voltage signal, by a second filtering circuit; and
comparing the noise level signal with a threshold value, by a comparing circuit.

12. The control method of claim 11, wherein when the noise level signal is not greater than the threshold value, the free run signal with the first level is outputted by the comparing circuit.

13. The control method of claim 11, wherein when the noise level signal is greater than the threshold value, the free run signal with the second level is outputted by the comparing circuit.

14. The control method of claim 11, wherein eight of the noise level signals are outputted by the second filtering circuit in a frame time.

15. The control method of claim 9, wherein when the noise sync signal is at a third level, the touch signal outputted by the display panel is not received by the processing circuit.

16. The control method of claim 15, wherein when the noise sync signal is at a fourth level different to the third level, the touch signal outputted by the display panel is received, and is converted into the location signal by the processing circuit.

* * * * *